United States Patent [19]

Iwasaki et al.

[11] Patent Number: 5,316,956
[45] Date of Patent: May 31, 1994

[54] METHOD FOR MANUFACTURING SEMICONDUCTOR LIGHT-RECEIVING ELEMENTS

[75] Inventors: Takashi Iwasaki; Yasuhiro Iguchi; Naoyuki Yamabayashi, all of Osaka, Japan

[73] Assignee: Sumitomo Electric Industries, Ltd., Osaka, Japan

[21] Appl. No.: 11,747

[22] Filed: Feb. 1, 1993

[30] Foreign Application Priority Data

Feb. 7, 1992 [JP] Japan .................................. 4-22954

[51] Int. Cl.$^5$ .......................................... H01L 31/18
[52] U.S. Cl. .......................................... 437/5; 437/3; 437/126; 437/133; 437/976; 257/190
[58] Field of Search ............... 437/2, 3, 5, 126, 133, 437/976; 257/188, 190, 200, 201, 442, 458, 461; 148/DIG. 97, DIG. 120

[56] References Cited

U.S. PATENT DOCUMENTS

| 4,879,250 | 11/1989 | Chan | 437/3 |
| 4,906,583 | 3/1990 | Kagawa et al. | 437/5 |
| 4,992,386 | 2/1991 | Furuyama et al. | 437/3 |
| 5,185,272 | 2/1993 | Makiuchi et al. | 437/3 |

FOREIGN PATENT DOCUMENTS

| 178673 | 4/1986 | European Pat. Off. | |
| 347157 | 12/1989 | European Pat. Off. | |
| 59-48963 | 3/1984 | Japan | 257/188 |
| 0213067 | 10/1985 | Japan | 437/2 |
| 1205471 | 8/1989 | Japan | 257/190 |

OTHER PUBLICATIONS

Forrest et al. IEEE electron Device Letters ED-L-2(11), Nov. 1981, pp. 283–285, "Low dark current, High efficiency Planar In Ga As/InP P–I–N diodes".
Applied Physics Letters, vol. 57, No. 13, Sep. 24, 1990 New York, U.S. pp. 1343–1344.
Second International Conference on Indium Phosphide and Related Materials, Apr. 23, 1990, Colorado, U.S., pp. 104–107.
Journal of the Electrochemical Society, vol. 128, No. 1 Jan. 1981, New Hampshire, U.S., pp. 210–212.
Journal of Crystal Growth, vol. 96, No. 1, May 1989, Amsterdam, NL, pp. 47–51.

Primary Examiner—Olik Chaudhuri
Assistant Examiner—Ramamohan Rao Paladugu
Attorney, Agent, or Firm—Sandler Greenblum & Bernstein

[57] ABSTRACT

A method for manufacturing semiconductor light-receiving elements is provided. The method includes the steps of forming an epitaxial layer including a light-receiving layer composed of at least In, Ga, and As on an n-InP substrate by supplying at least In gas, Ga gas, and As gas to a surface of the n-InP substrate from one side of a container accommodating the n-InP substrate, forming a p-type layer in the configuration of a floating island by thermally diffusing a p-type impurity into the light-receiving layer, and separating the n-InP substrate on which the p-type layer has been formed into semiconductor light-receiving elements.

11 Claims, 8 Drawing Sheets

METHOD FOR MANUFACTURING SEMICONDUCTOR LIGHT-RECEIVING ELEMENTS

BACKGROUND OF THE INVENTION

1. Field of the Invention

The present invention relates to a method for manufacturing a semiconductor light-receiving elements and more particularly to a method for efficiently and yieldingly manufacturing a PIN construction in a compound semiconductor thin film by vapor growth method grown on an InP substrate suitable for manufacturing the semiconductor light-receiving elements preferably applied to an optical communication system or measurement in a wavelength of greater than 0.9 μm (general 1ly, 1.25 to 1.60 μm).

2. Description of the Related Arts

In manufacturing the semiconductor light-receiving elements, first, mixed crystal of InGaAs is grown on an InP substrate by vapor growth method to form a light-receiving layer and then a p-type impurity is introduced into the N-type light-receiving layer having a low carrier density to form a depletion portion. In the depletion portion, an optical signal which has been incident on the semiconductor light-receiving elements is converted into an electric signal. Normally, the depletion portion is formed by introducing a p-type impurity such as Zn, Cd, Be or Mg into the epitaxial crystal of the light-receiving layer by thermal diffusion method. Then, a film for preventing incident light from being reflected and a signal fetch electrode are formed on the surface of the semiconductor light-receiving elements.

The size of an epitaxial wafer is approximately one inch square due to the limiting condition of wafer processing. Therefore, the configuration of a wafer is not affected by the composition distribution of the epitaxial layer. In this situation, in order to manufacture a good quality semiconductor light-receiving elements, it is necessary that the composition distribution of the epitaxial layer is uniform, i.e., the composition of the epitaxial layer matches the crystal lattice of the substrate.

Suppose that the epitaxial layer has been formed on a substrate in a comparatively large size, for example, approximately two inches in diameter by vapor growth method in order to improve the production rate per wafer. As a result, the configuration of the wafer is affected by the composition distribution of the epitaxial layer and consequently convexes and concaves are formed on the wafer. The convexes and concaves thus formed cause concentration, which causes the formation of a defective crystal and increases dark current.

In the method for manufacturing the semiconductor light-receiving elements, temperatures for growing the epitaxial layer, for thermally diffusing a p-type impurity, and for forming an insulating film are higher than the room temperature. As a result, various thermal stresses act on the crystal of the epitaxial layer, which causes the formation of a defective crystal or the destruction of the crystal.

In forming a light-receiving layer consisting of InGaAs on a substrate consisting of InP, if the composition of the epitaxial layer matches the crystal lattice of the substrate at the growth temperature of the epitaxial layer, tensile stress acts on the crystal of the epitaxial layer at the room temperature while if the composition of the epitaxial layer matches the crystal lattice of the substrate at the room temperature, compressive stress acts thereon at the growth temperature. These phenomena occur because the coefficient of thermal expansion of InGaAs is higher than that of InP.

In the thermal diffusion method, not only thermal stress acts on the crystal of the epitaxial layer, but also impurities are diffused in the crystal lattice of the epitaxial layer. As a result, there is a high possibility that the crystal becomes defective and accordingly, there is a high possibility that dark current increases in thermal diffusion process.

The thermal stress is affected by the thickness of the epitaxial layer. That is, the larger the thickness of the epitaxial layer is, the greater thermal stress is. The thickness of the light-receiving portion of the epitaxial layer is related to the sensitivity of the light-receiving elements. Preferably, the thickness of the light-receiving layer is large in terms of sensitivity of the light-receiving elements.

SUMMARY OF THE INVENTION

This invention provides a method for efficiently and yieldingly manufacturing a semiconductor light-receiving elements when the lattice mismatch ratio of the light-receiving layer to InP has a distribution in a wafer which is affected by the composition distribution of an epitaxial layer.

To accomplish these objects of the present invention, there is provided a method for manufacturing semiconductor light-receiving elements comprising the steps of: forming an epitaxial layer including a light-receiving layer composed of at least In, Ga, and As on an n-InP substrate by supplying at least In gas, Ga gas, and As gas to the surface of the n-InP substrate from one side of a container accommodating the n-InP substrate; forming a p-type layer in the configuration of a floating island by thermally diffusing a p-type impurity into the light-receiving layer; and separating the n-InP substrate on which the p-type layer has been formed into semiconductor light-receiving elements. The separation of the n-InP substrate into semiconductor light-receiving elements is carried out only in the region in which lattice mismatch ratio $\Delta a/a$, of the light-receiving layer to InP, linearly changing from the gas supply side of the container to the downstream side thereof is greater than $-0.20\%$ and smaller than 0% in the following equation:

$$\Delta a/a = [\{(\text{lattice constant of light-receiving layer}) - (\text{lattice constant of InP})\}/(\text{lattice constant of InP})] \times 100 \, (\%).$$

Preferably, the epitaxial layer comprises an n-type InP layer formed on the n-InP substrate, the light-receiving layer formed on the n-InP layer, and an InP layer formed on the light-receiving layer.

Suppose that the light-receiving layer is composed of $In_xGa_{1-x}As$ ($0 \leq x \leq 1$), it is preferable that the composition of the light-receiving layer is: $0.50 \leq x \leq 0.53$.

In gas, Ga gas, As gas, and P gas are supplied to the n-InP substrate so that the light-receiving layer may be composed of $In_xGa_{1-x}As_yP_{1-y}$ ($0 \leq x \leq 1$, $0 \leq y \leq 1$).

The epitaxial layer is formed by vapor growth method. Preferably, chloride method is adopted to obtain chloride gas as the In gas, Ga gas, and, in addition, P gas and As gas formed by decomposing from these chloride.

Preferably, the thickness of the light-receiving layer is greater than 2.0 μm and smaller than 6.0 μm when the composition of the light-receiving layer is in the abovedescribed range.

As the p-type impurity, Zn, Be, Mg or Cd can be selected.

According to the above method, the n-InP substrate is separated into semiconductor light-receiving elements in only the region in which lattice mismatch ratio $\Delta a/a$ of the light-receiving layer distributed in the wafer to InP is greater than $-0.20\%$ and smaller than 0%. The lattice mismatch ratio is linearly related to the composition of the light-receiving layer. Suppose that the light-receiving layer is made of $In_xGa_{1-x}As$, the range of the lattice mismatch ratio $\Delta a/a$ greater than $-0.20\%$ and smaller than 0% corresponds to $0.50 \leq x \leq 0.53$. In carrying out device processing and separating the n-InP substrate into semiconductor light-receiving elements in the above-described range of the lattice mismatch ratio $\Delta a/a$, the dark current of the manufactured semiconductor light-receiving elements can be made to be smaller than 1.0nA. Hence, even though a substrate as large as more than two inches which may influence the configuration of a wafer is used, semiconductor light-receiving elements having a desired sensitivity can be efficiently and yieldingly manufactured with dark current generated below a desired value.

Since chloride method is adopted to obtain chloride gas as the In gas, Ga gas, and, in addition, P gas and As gas formed by decomposing from these chloride, in forming the epitaxial layer by vapor growth method, a highly pure crystal can be obtained stably.

A predetermined sensitivity can be obtained and a defective crystal due to such as a misfit dislocation is not formed by setting the composition of the light-receiving layer to the above-described range and the thickness of the light-receiving layer to be greater than 2.0 $\mu$m and smaller than 6.0 $\mu$m.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE INVENTION

Figure 1:
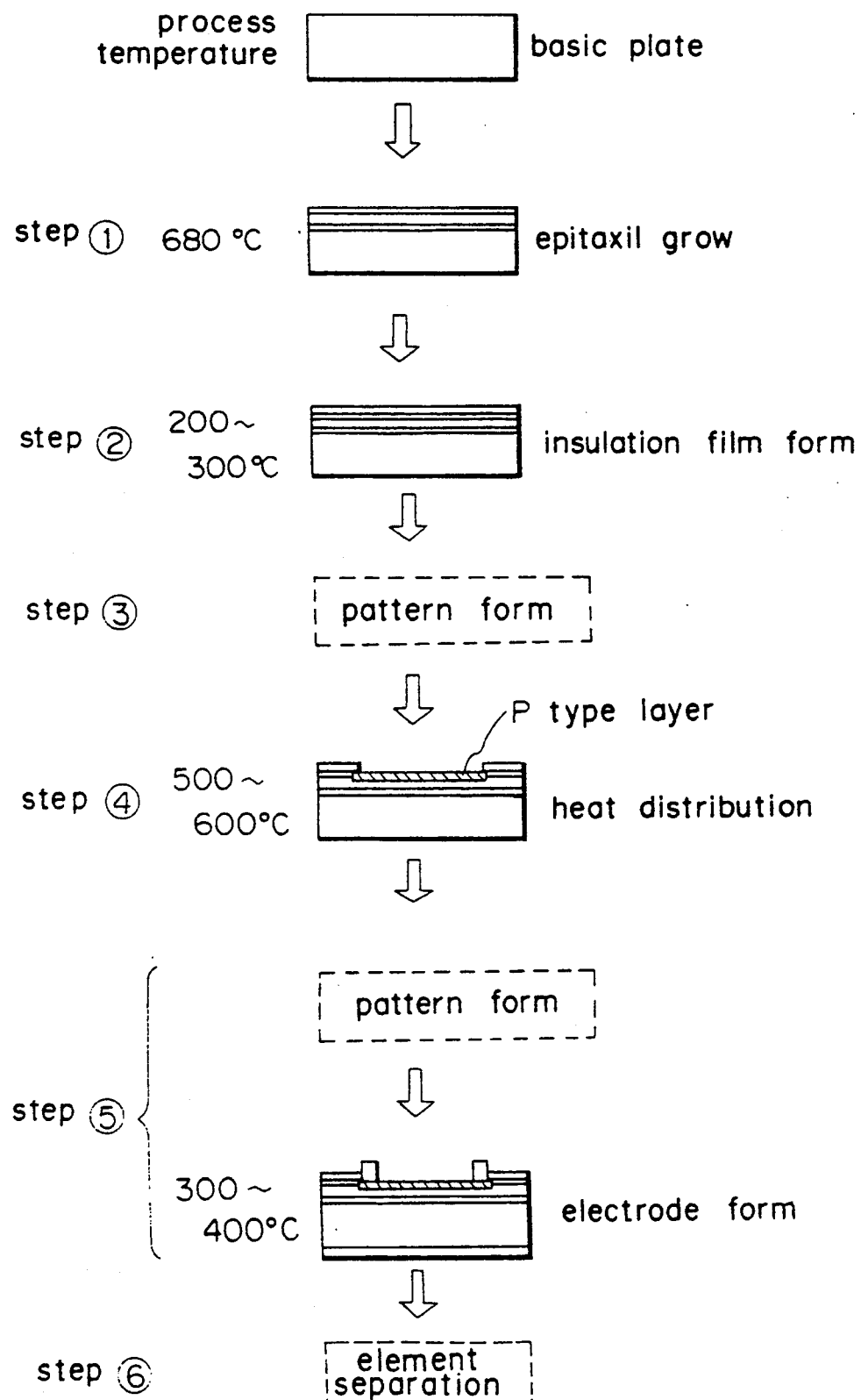
FIG. 1 is a schematic process view showing a method for manufacturing semiconductor light-receiving elements according to the present invention.

Before the description of the present invention proceeds, it is to be noted that like parts are designated by like reference numerals throughout the accompanying drawings.

Figure 2:
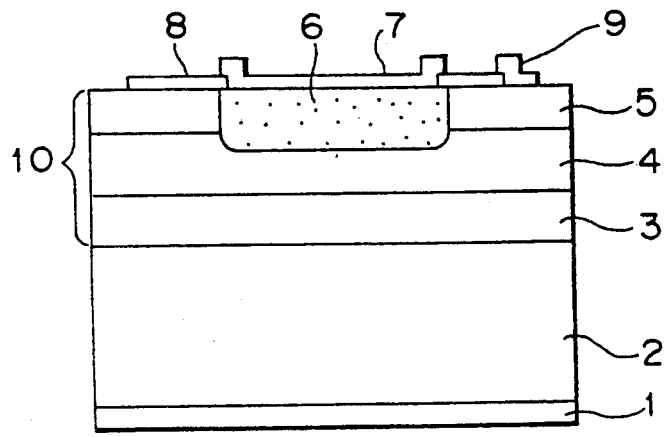
FIG. 2 is a schematic view showing the construction of a semiconductor light-receiving elements manufactured by the manufacturing method according to the present invention.

A method for manufacturing a semiconductor light-receiving elements according to an embodiment of the present invention will be described below with reference to the drawings. A PIN-type photodiode manufactured by the method of the present invention comprises an epitaxial layer 10 formed by vapor growth method on an n-InP substrate 2 in the thickness of 350 $\mu$m and connected with an n-side electrode 1, as shown in FIG. 2. The epitaxial layer 10 comprises an InP buffer layer 3 in the thickness of 2 $\mu$m, a light-receiving layer 4 consisting of InGaAs in the thickness of 4 $\mu$m, an InP window layer 5 in the thickness of 2 $\mu$m; a p-type layer 6 formed in the configuration of a floating island by diffusing Zn as a p-type impurity on the light-receiving layer 4 by thermal diffusion method; a reflection-preventing film 7 formed on the p-type layer 6; and an insulating film 8 and a p-side electrode 9 formed on the InP window layer 5.

The InP buffer layer 3, the light-receiving layer 4, and the InP window layer 5 are formed on the n-InP substrate 2 as follows by the vapor growth method (process 1.)

Figure 3:
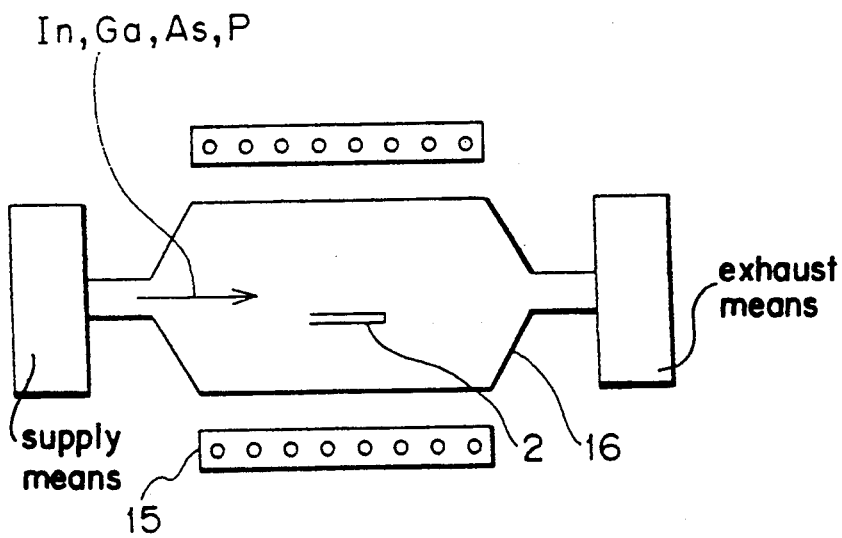
FIG. 3 is a schematic view showing an apparatus for forming an epitaxial layer by means of vapor growth method.

As shown schematically in FIG. 3, In gas, Ga gas, P gas, and As gas are sequentially supplied from the upstream side of a quarts container 16 toward the downstream side thereof by a known method in parallel with one surface of the n-InP substrate 2, with the quarts container 16 horizontally accommodating the n-InP substrate 2, two inches in diameter, heated to 680° by a heating means 15. In this manner, the InP buffer layer 3, the light-receiving layer 4, and the InP window layer 5 are sequentially epitaxially grown on the n-InP substrate 2.

In this embodiment, chloride method is adopted to obtain chloride gas as the In gas, Ga gas, and, in addition, P gas and As gas formed by decomposing from these chloride. In this manner, a highly pure crystal can be obtained stably.

Figure 4:
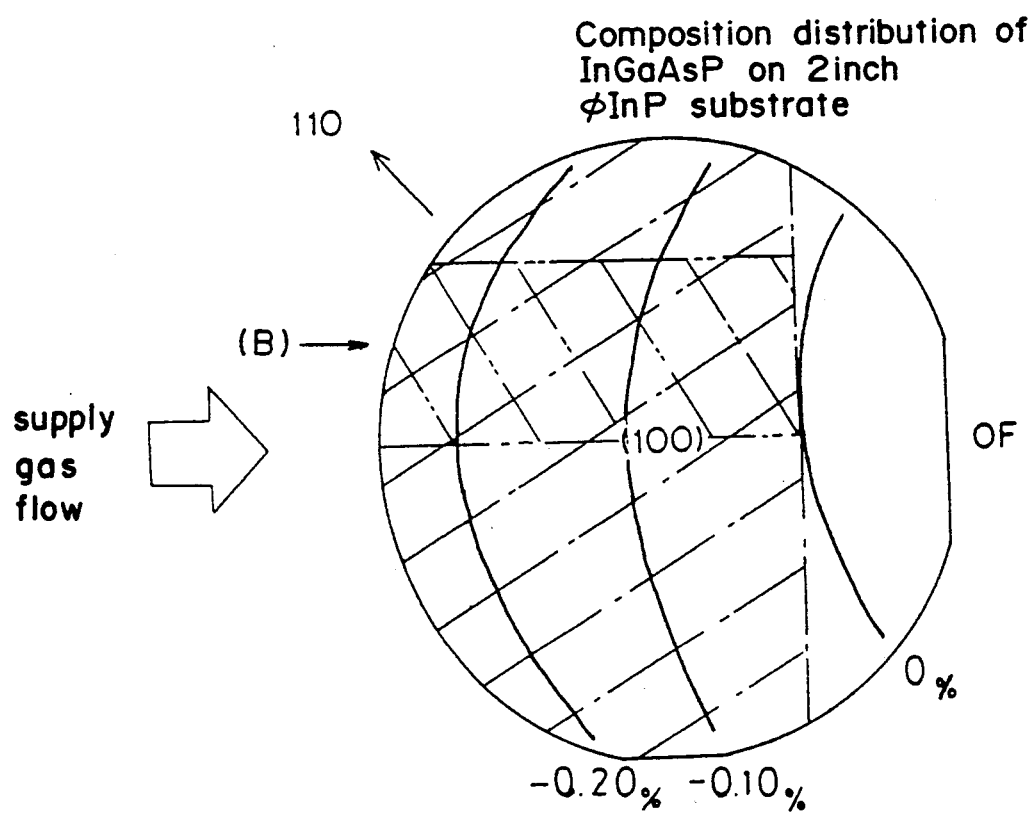
FIG. 4 is a schematic view showing the distribution of lattice mismatch ratio in a wafer.

As shown in FIG. 4, in the epitaxial layer 10 formed on the n-InP substrate 2, the lattice mismatch ratio of the light-receiving layer 4 to InP (hereinafter referred to as lattice mismatch ratio $\Delta a/a$) has a distribution which linearly increases in the direction from the gas supply side of the quarts container 16 to the downstream side thereof.

The lattice mismatch ratio $\Delta a/a$ is defined by the following equation:

$$\Delta a/a = [\{(\text{lattice constant of light-receiving layer}) - (\text{lattice constant of InP})\}/(\text{lattice constant of InP})] \times 100 \ (\%).$$

Figure 5:
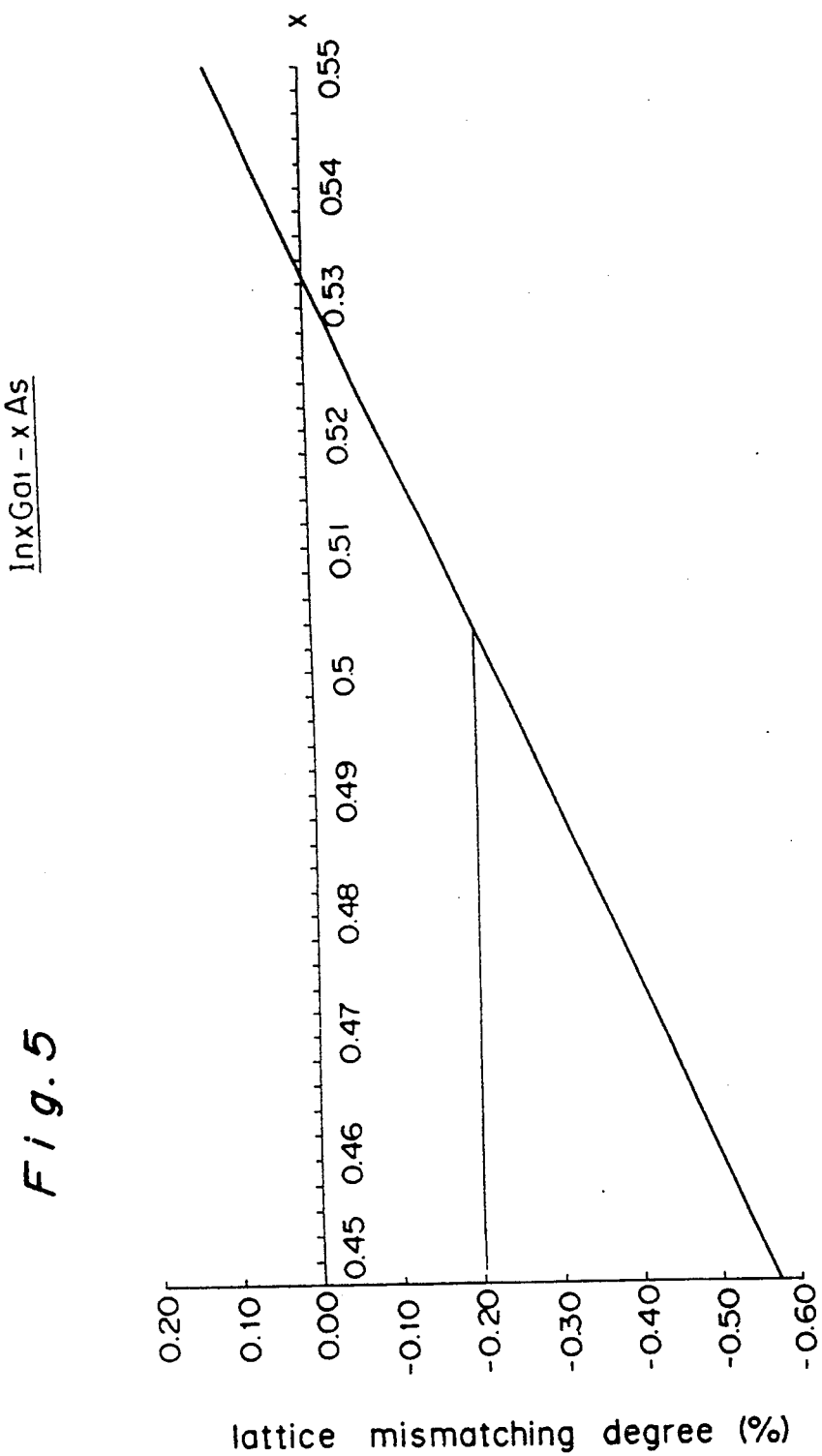
FIG. 5 is a graph showing the relationship between lattice mismatch ratio and the composition of InGaAs.

As shown in FIG. 5, the lattice mismatch ratio $\Delta a/a$ is linearly related with the composition of InGaAs composing the light-receiving layer 4. That is, the lattice mismatch ratio $\Delta a/a$ is linearly related with (x) of $In_x$-$Ga_{1-x}As$. Accordingly, the composition of InGaAs has a distribution which linearly increases from the gas supply side of the quarts container 16 to the downstream side thereof similarly to the lattice mismatch ratio $\Delta a/a$.

In this embodiment, since the composition of InGaAs, namely, the lattice mismatch ratio $\Delta a/a$ has such a distribution as described above in a wafer, warpage is generated on the growth side of the epitaxial layer 10 and as a result, concaves and convexes are generated thereon.

Figure 6:
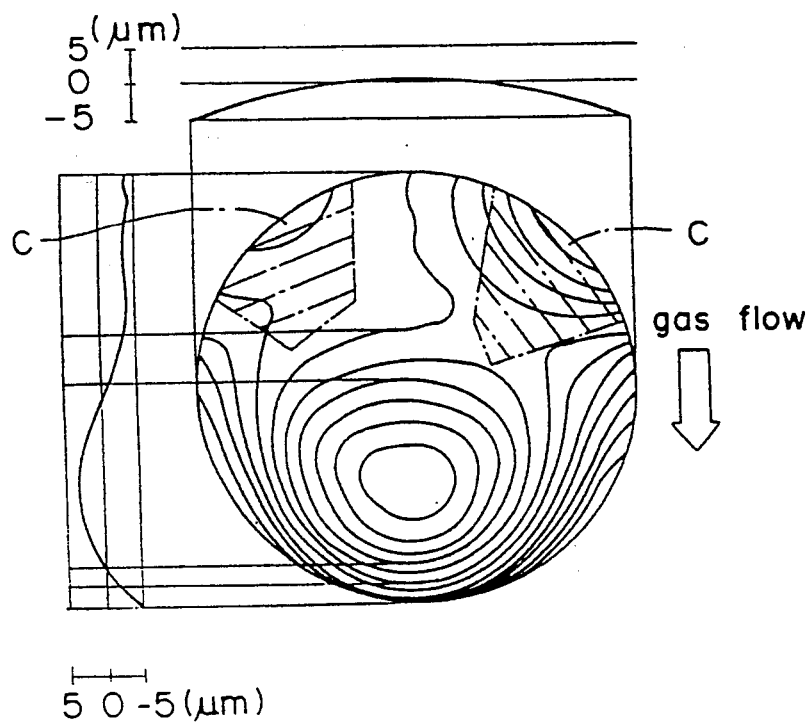
FIG. 6 is a schematic view showing the distribution of the convex and concave of the growth surface of the epitaxial layer.

Comparing FIG. 4 and FIG. 6 with each other, in the region in which the lattice mismatch ratio $\Delta a/a$ is positive, the surface of the epitaxial layer 10 on the growth side thereof is convex while in the region in which the lattice mismatch ratio $\Delta a/a$ is negative, the surface of the epitaxial layer 10 on the growth side thereof is concave. Because the coefficient of InGaAs composing the light-receiving layer 4 and that of the InP are different from each other, and the thickness of the light-receiving layer 4 is smaller than that of the InP substrate 2, the lattice mismatch ratio $\Delta a/a$ and the convex and concave of the surface of the epitaxial layer 10 on the growth side thereof are related to each other.

In one piece of wafer in which the lattice mismatch ratio $\Delta a/a$ of InGaAs composing the light-receiving layer 4 to the InP has such a distribution as described above, a device processing is carried out only in the region in which the lattice mismatch ratio $\Delta a/a$ is greater than $-0.20\%$ and smaller than 0%, namely, only in the region shown by one-dot chain line in FIG. 4. The region in which the lattice mismatch ratio is smaller than $-0.20\%$ and greater than 0% is removed from the wafer in cleavage direction.

The reason the device processing is carried out in the region in which the lattice mismatch ratio $\Delta a/a$ is smaller than 0% is because the surface of the epitaxial layer 10 on the growth side thereof is convex in the region in which the lattice mismatch ratio $\Delta a/a$ is positive as described above. As a result, the following disadvantage occurs in the device processing.

That is, in thermal diffusion process and electrode forming process, a device pattern is formed in photographic transfer process. If the surface of the epitaxial layer 10 is convex, exposure period of time and focal lengths are varied depending on a place and there are few places at which focusing can be accomplished. Thus, the device processing cannot be performed with accuracy.

When a mask made of a hard glass is pressed against the surface of the epitaxial layer 10 in the photographic transfer process so as to make the convex portion flat, stress concentrates on a point of the top portion of the convex portion, which gives a bad influence on the crystal of the epitaxial layer 10. A compound semiconductor crystal is frail and hence the crystal cracks.

In the region in which the lattice mismatch ratio $\Delta a/a$ exceeds 0%, device processing will be carried out with a small yield of semiconductor light-receiving elements. Therefore, the region is removed from the wafer in this embodiment.

On the other hand, in the region in which the surface of the epitaxial layer 10 on the growth side thereof is concave, the degree of warpage is smaller than the convex region. Thus, the concave region can be focused favorably more than the convex region in forming a device pattern in the photographic transfer process. In addition, stress does not concentrate on a point even though the hard glass is pressed against the surface of the epitaxial layer 10 but acts on the concave region dispersedly, which does not affect the crystal of the epitaxial layer 10 unfavorably.

The device processing is carried out in the region in which the lattice mismatch ratio $\Delta a/a$ is greater than 0.20%. Because, the dark current of the completed semiconductor light-receiving elements exceeds 1.0nA and noise is so large that it cannot be used practically.

A wafer is processed after the convex region has been removed.

First, the insulating film 8 consisting of such a material as $SiO_2$, SiON or SiN is formed on the growth side of the epitaxial layer 10 with the wafer held in a container in which temperature is set to 200° C. to 300° C. (process 2).

A pattern is formed in process 3.

Figure 7:
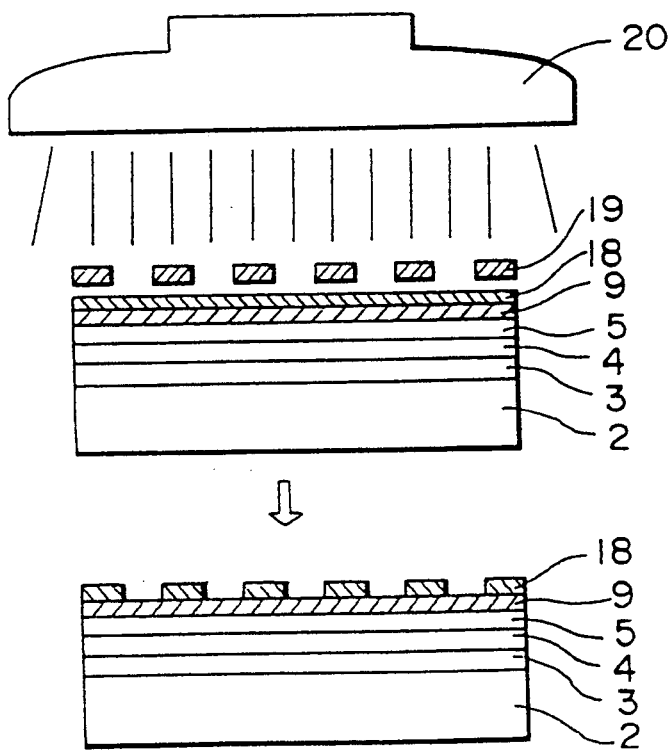
FIG. 7 is a schematic view showing an example of a pattern formation.

As shown in FIG. 7, a resist 18 is applied to the surface of the insulating film 9 and then, a mask 19 corresponding to the pattern to be formed on the resist 18 is disposed above the resist 18.

The mask pattern is printed in plate on the resist 18 by beam of light emitted by a light source 20. As described previously, since the convex region is removed from the wafer, focusing can be reliably accomplished.

In this process, hard contact method for pressing a transparent member (not shown) such as a hard glass against the mask 19 is adopted to bring the mask 19 into close contact with the surface of the resist 18. As described previously, only the concave region remains on the wafer. Accordingly, stress generated by the pressing of the transparent member against the mask 19 is dispersed, which does not affect the crystal of the epitaxial layer 10 unfavorably.

After exposure and printing in plate are carried out, development and etching are performed to form an opening in the insulating film 9. The opening corresponds to the light receiving region, namely, the p-type layer 6 of the light-receiving layer 4. In this embodiment, the diameter of the light-receiving area is 100 $\mu$m.

Then, the p-type impurity is thermally diffused into the light-receiving layer 4 to form the p-type layer 6 and a depletion portion (process 4). In this embodiment, Zn is used as the p-type impurity, but Be, Mg or Cd can be used.

The thermal diffusion method is carried out in a sealed tube as well known. The processing temperature ranges from 500° C. to 600° C.

Similar to process 3, the reflection preventing film 7 and the electrode 9 are formed by a pattern formation and then the wafer is separated into semiconductor light-receiving elements of 500 $\mu$m square (process 6)

FIGS. 8 and 9 show the distribution of the lattice mismatch ratio $\Delta a/a$ of the semiconductor light-receiving elements manufactured by the manufacturing method according to this embodiment and the distribution of dark current, respectively. FIGS. 8 and 9 show only a region (B) shown by two-dot chain lines of FIG. 4. This is because the lattice mismatch ratio $\Delta a/a$ is positive on the side downstream of the center of the wafer and the distribution of the lattice mismatch ratio $\Delta a/a$ in the wafer is symmetrical around the center in FIG. 4.

As described above, it is confirmed that the allowable range of dark current of the semiconductor light-receiving elements is smaller than 1.0nA and that in the semiconductor light-receiving elements corresponding to the region of the wafer in which the lattice mismatch ratio Δa/a is greater than −0.20% and smaller than 0%, the dark current of the semiconductor light-receiving elements is smaller than 1.0nA.

It can be confirmed that in the semiconductor light-receiving elements corresponding to the region of the wafer in which the lattice mismatch ratio Δa/a is smaller than 0.20%, the dark current thereof exceeds 1.0nA.

According to the method of this embodiment, dark current is excellently smaller than 1.0nA though processing temperature changes in the wide range from the room temperature to 680° C. in process 1 through process 6 and though the p-type impurity is diffused into the light-receiving layer 4 in the thermal diffusion method at a temperature from 500° to 600° C. This excellent result is attributed to the device processing performed only when the lattice mismatch ratio Δa/a is greater than −0.20% and smaller than 0% at the room temperature. In such a range of lattice mismatch ratio Δa/a, the crystal has no defect such as misfit dislocation and has only compressive stress between the epitaxial layer and substrate 2 which is relaxed when the processing temperature becomes high in the device processing, for example, in the thermal diffusion process because the coefficient of thermal expansion of InGaAs composing the light-receiving layer 4 is greater than that of InP.

In the above description, the thickness of the light-receiving layer is set to 4 μm, but not limited thereto.

Figure 10:
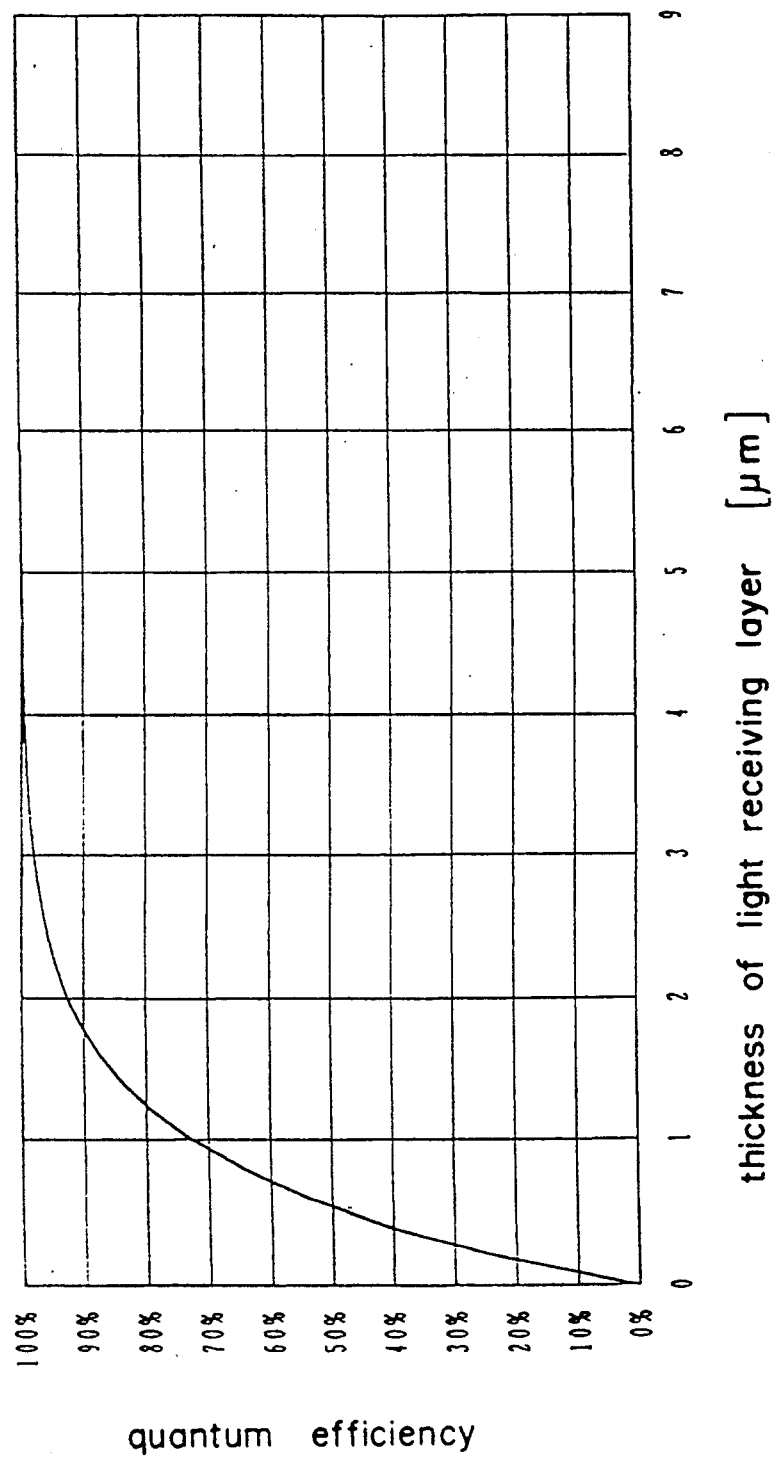
FIG. 10 is a graph showing the relationship between the thickness of a light-receiving layer and quantum efficiency.

The thickness of the light-receiving layer 4 affects the sensitivity of the semiconductor light-receiving elements, and there is a relationship as shown in FIG. 10 between the thickness of the light-receiving layer and quantum efficiency. Thus, in order to absorb more than 90% of incident beam, it is necessary that the thickness of the light-receiving layer 4 is greater than 2 μm.

In the process for growing the epitaxial layer according to the embodiment, the thicknesses of the light-receiving layers 4 were varied to examine the sensitivity of the semiconductor light-receiving elements and X-ray topography was carried out.

The result is that misfit dislocation was observed even when the lattice mismatch ratio Δa/a was within the range set in the embodiment, namely, greater than −0.20% and smaller than 0%. When the thickness of the light-receiving layer 4 set to 6.5 μm, a misfit dislocation was observed in the vicinity of the region shown by (C) in FIG. 6. When the misfit dislocation is generated, apparently, dark current exceeds 1.0nA. It is necessary that the thickness of the light-receiving layer 4 is smaller than 6.0 μm.

The above experiment indicates that it is necessary that the thickness of the light-receiving layer 4 is greater than 2.0 μm and smaller than 6.0 μm.

The present invention is not limited to the above embodiment, but may be modified.

The light-receiving layer is composed of InGaAs in the above embodiment, but may be composed of InGaAsP by supplying In gas, Ga gas, As gas, and P gas to the n-InP substrate in the process of forming the epitaxial layer by vapor growth method.

In the embodiment, the epitaxial layer comprises the InP buffer layer, the light-receiving layer, and the n-type window layer formed on the n-InP substrate, but may comprise only the light-receiving layer.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of manufacturing semiconductor light-receiving elements comprising the steps of;

forming an epitaxial layer including a light-receiving layer composed of at least In, Ga, and As on an N-InP substrate by supplying at least In gas, Ga gas, and As gas to a surface of the n-InP substrate from a gas supply side of a container accommodating the n-InP substrate;

forming a p-type layer in the configuration of a floating island by thermally diffusing a p-type impurity into the light-receiving layer; and separating the n-InP substrate on which the p-type layer has been formed into semiconductor light-receiving elements so that the separation of the n-InP substrate into semiconductor light-receiving elements is carried out only in a region in which a lattice mismatch ratio Δa/a of the light-receiving layer to InP, that linearly changes from the gas supply side of the container to a downstream side thereof, is substantially within a range of −0.20% to 0%, wherein $$\Delta a/a = \frac{\left\{ \left( \begin{array}{c} \text{lattice constant of the} \\ \text{light-receiving layer} \end{array} \right) - \left( \begin{array}{c} \text{lattice constant} \\ \text{of InP} \end{array} \right) \right\}}{(\text{lattice constant of InP})} \times 100\%.$$

2. A method for manufacturing semiconductor light-receiving elements as defined in claim 1, wherein the step of forming the epitaxial layer further comprises sequentially forming an n-type InP layer, the light-receiving layer, and an InP layer on the n-InP substrate, such that the n-type InP layer is disposed on the n-InP layer, the light-receiving layer is disposed on the n-type InP layer, and the InP layer is disposed on the light-receiving layer.

3. A method for manufacturing semiconductor light-receiving elements as defined in claim 1, wherein the light-receiving layer is made of InGaAs.

4. A method for manufacturing semiconductor light-receiving elements as defined in claim 3, wherein the composition of $In_xGa_{1-x}As$ composing the light-receiving layer is such that x is substantially within the range of 0.50 to 0.53.

5. A method for manufacturing semiconductor light-receiving elements as defined in claim 1, wherein In gas, Ga gas, As gas and P gas are supplied to the n-InP substrate so that the light-receiving layer is composed of InGaAsP.

6. A method for manufacturing semiconductor light-receiving elements as defined in claim 5, further comprising the step of obtaining In and Ga and also obtaining the P gas and As gas by decomposing the chlorides of those materials.

7. A method for manufacturing semiconductor light-receiving elements as defined in claim 1, wherein the thickness of the light-receiving layer is substantially within the range of 2.0 μm to 6.0 μm.

8. A method for manufacturing semiconductor light-receiving elements as defined in claim 1, wherein the p-type impurity is Zn.

9. A method for manufacturing semiconductor light-receiving elements as defined in claim 1, wherein the p-type impurity is Be.

10. A method for manufacturing semiconductor light-receiving elements as defined in claim 1, wherein the p-type impurity is Mg.

11. A method for manufacturing semiconductor light-receiving elements as defined in claim 1, wherein the p-type impurity is Cd.

* * * * *

UNITED STATES PATENT AND TRADEMARK OFFICE
CERTIFICATE OF CORRECTION

PATENT NO. : 5,316,956
DATED : May 31, 1994
INVENTOR(S) : T. IWASAKI et al.

It is certified that error appears in the above-indentified patent and that said Letters Patent is hereby corrected as shown below:

At column 3, line 2, change "abovedescribed" to ---above-described---.

Figure 8A:
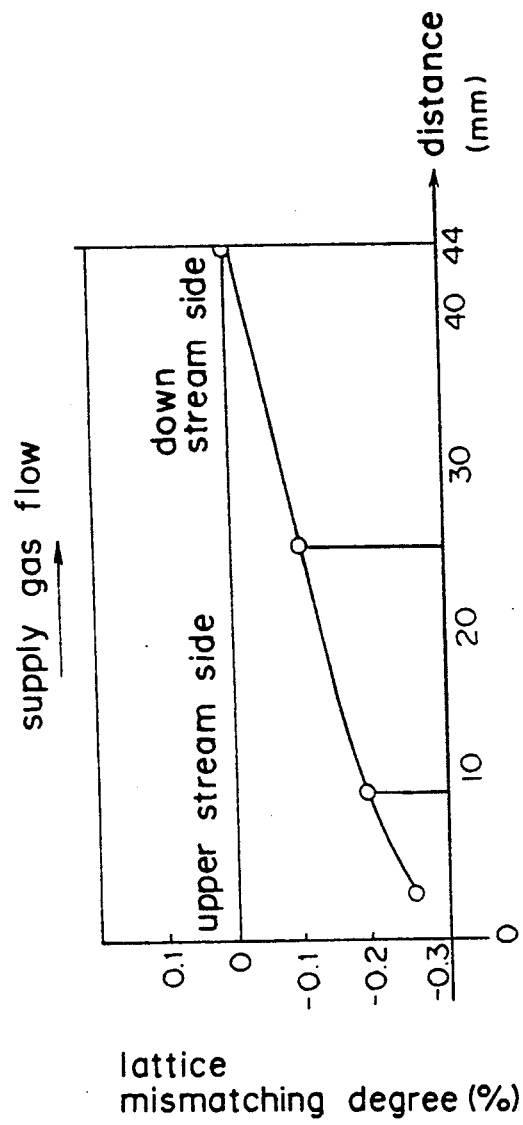
FIG. 8 is a graph showing the relationship between the flow of supplied gas and the distribution of lattice mismatch ratio.
Figure 8B:
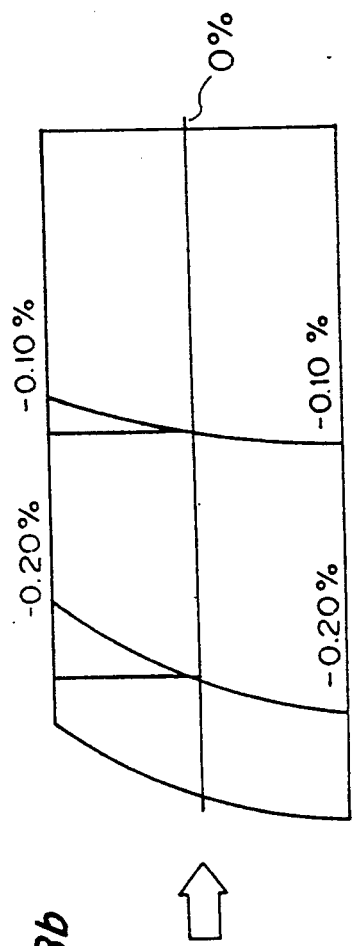

At column 3, line 66, change "Fig. 8 is a graph" to ---Figs. 8a and 8b are graphs---.

Figures 9A, 9B:
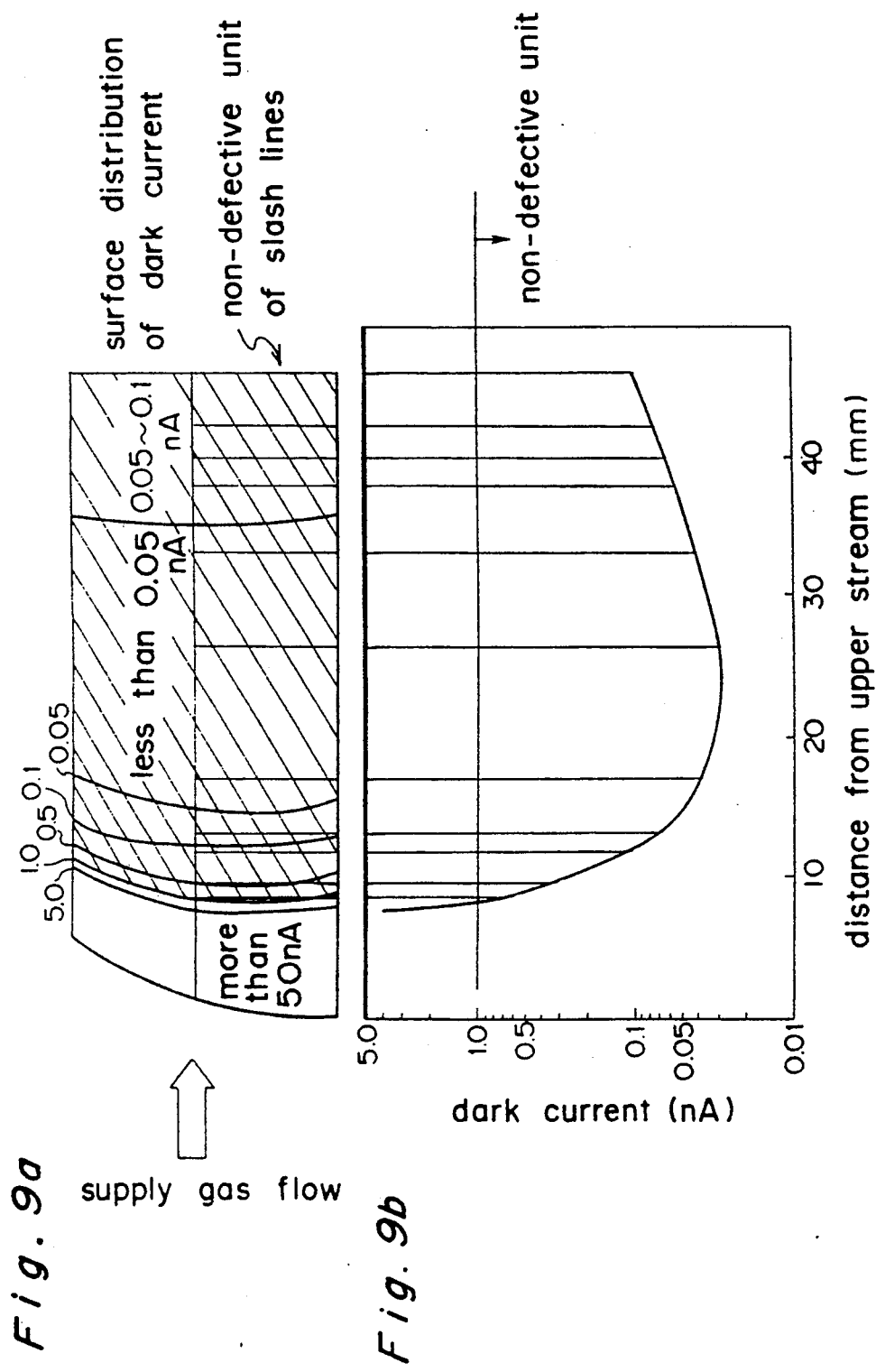
FIG. 9 is a graph showing the relationship between the flow of supplied gas and the distribution of dark current.

At column 4, line 1, change "Fig. 9 is a graph" to ---Figs. 9a and 9b are graphs---.

At column 6, line 54, change "Figs. 8 and 9" to ---Figs. 8a. 8b, 9a. and 9b---.

At column 6. line 58. change "Figs. 8 and 9" to ---Figs. 8a. 8b. 9a. and 9b---.

At column 8. line 12 (claim 1. line 5). change "N-InP" to ---n-InP---.

Signed and Sealed this

Nineteenth Day of November, 1996

Attest:

BRUCE LEHMAN

*Attesting Officer*  *Commissioner of Patents and Trademarks*